(12) United States Patent
Gardner et al.

(10) Patent No.: US 6,242,317 B1
(45) Date of Patent: Jun. 5, 2001

(54) HIGH QUALITY ISOLATION STRUCTURE FORMATION

(75) Inventors: Mark I. Gardner, Cedar Creek; Thien T. Nguyen; Charles E. May, both of Austin, all of TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/264,103

(22) Filed: Mar. 8, 1999

(51) Int. Cl.[7] .................................................. H01L 21/76
(52) U.S. Cl. ............................................. 438/400; 438/788
(58) Field of Search ..................................... 438/218, 221, 438/296, 400, 595, 396, 404, 424, 753, 788

(56) References Cited

U.S. PATENT DOCUMENTS 6,074,919 * 6/2000 Gardner et al. ...................... 438/287
6,100,205 * 8/2000 Liu et al. ............................. 438/788

* cited by examiner

Primary Examiner—David Nelms
Assistant Examiner—Phuc T. Dang
(74) Attorney, Agent, or Firm—Williams, Morgan & Amerson

(57) ABSTRACT

A method is provided for fabricating an isolation structure, the method including forming a first dielectric layer above a structure and forming an opening in the first dielectric layer and the structure, the opening having sidewalls and a bottom. The method also includes forming a second dielectric layer within the opening on a first portion of the sidewalls and above the bottom of the opening. The method further includes forming a third dielectric layer within the opening adjacent the second dielectric layer and on a second portion of the sidewalls of the opening. The method also further includes passivating bonds in the third dielectric layer to reduce charge-trapping in the third dielectric layer, forming dielectric spacers within the opening adjacent the third dielectric layer and forming a dielectric filler within the opening adjacent the dielectric spacers and above the third dielectric layer.

20 Claims, 10 Drawing Sheets

_US 6,242,317 B1_

HIGH QUALITY ISOLATION STRUCTURE FORMATION

BACKGROUND OF THE INVENTION

1. Field of the Invention

This invention relates generally to semiconductor fabrication technology, and, more particularly, to a method of fabricating an isolation structure.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

Typically, overall reduction in scale of the components of a typical transistor to increase the overall speed of the MOSFET or MOS transistor, and to increase the density, and number, of the transistors that can be produced on a given amount of wafer real estate, also requires a reduction in scale of the isolation structures that separate and electrically isolate semiconductor devices from each other. For example, in a CMOS device, an isolation structure is typically used to separate and electrically isolate the NMOS transistor from the PMOS transistor. It has proven difficult to form scaled-down isolation structures that reduce or eliminate charge-trapping in the isolation structures. It has also proven difficult to integrate the formation of isolation structures with the formation of gate dielectrics for MOS transistors, for example. Typically, isolation structures are disadvantageously exposed during subsequent processing, and this reduces the reliability of the isolation structures and of the semiconductor devices in which such isolation structures are contained.

The present invention is directed to overcoming, or at least reducing the effects of, one or more of the problems set forth above.

SUMMARY OF THE INVENTION

In one aspect of the present invention, a method is provided for fabricating an isolation structure, the method including forming a first dielectric layer above a structure and forming an opening in the first dielectric layer and the structure, the opening having sidewalls and a bottom. The method also includes forming a second dielectric layer within the opening on a first portion of the sidewalls and above the bottom of the opening. The method further includes forming a third dielectric layer within the opening adjacent the second dielectric layer and on a second portion of the sidewalls of the opening. The method also further includes passivating bonds in the third dielectric layer to reduce charge-trapping in the third dielectric layer, forming dielectric spacers within the opening adjacent the third dielectric layer and forming a dielectric filler within the opening adjacent the dielectric spacers and above the third dielectric layer.

BRIEF DESCRIPTION OF THE DRAWINGS

The invention may be best understood by reference to the following description taken in conjunction with the accompanying drawings, in which the leftmost significant digit(s) in the reference numerals denote(s) the first figure in which the respective reference numerals appear, and in which.

Figure 1:
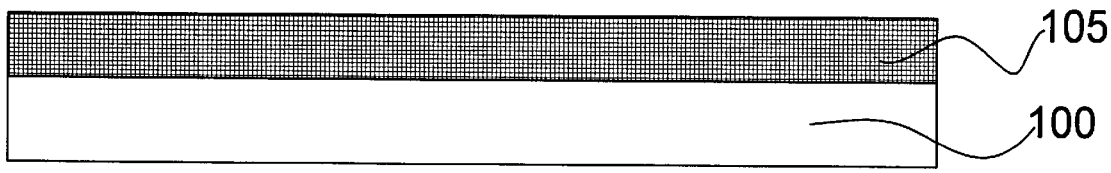
FIGS. 1–15 illustrate schematically in cross-section various embodiments of a method for isolation structure fabrication according to the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for isolation structure fabrication according to the present invention are shown in FIGS. 1–24. Although the various regions and structures of a semiconductor device are depicted in the drawings as having very precise, sharp configurations and profiles, those skilled in the art recognize that, in reality, these regions and structures are not as precise as indicated in the drawings. Nevertheless, the attached drawings are included to provide illustrative examples of the principles of the present invention.

In general, the present invention is directed towards the manufacture of a semiconductor device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

Figure 23:
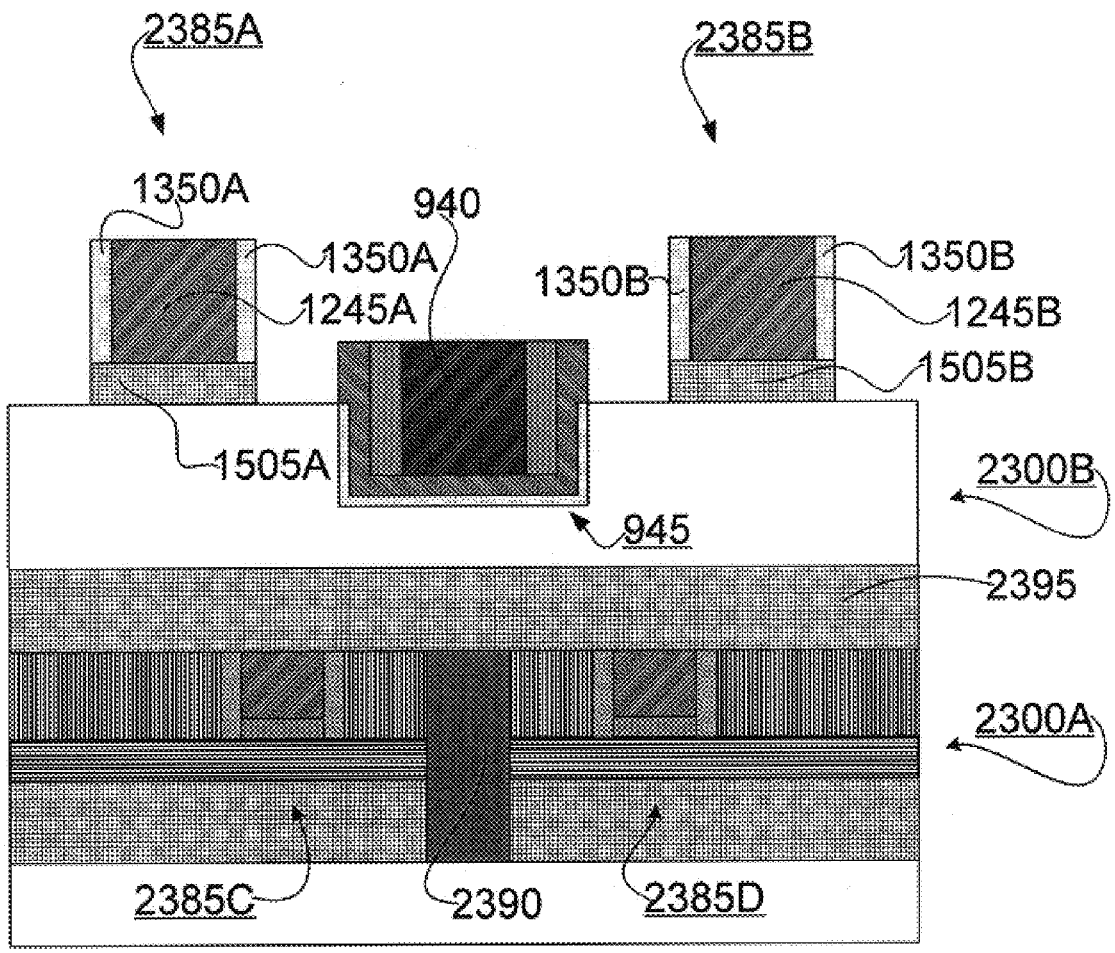
FIG. 23 illustrates schematically in cross-section another embodiment of a method for isolation structure fabrication according to the present invention.
Figure 24:
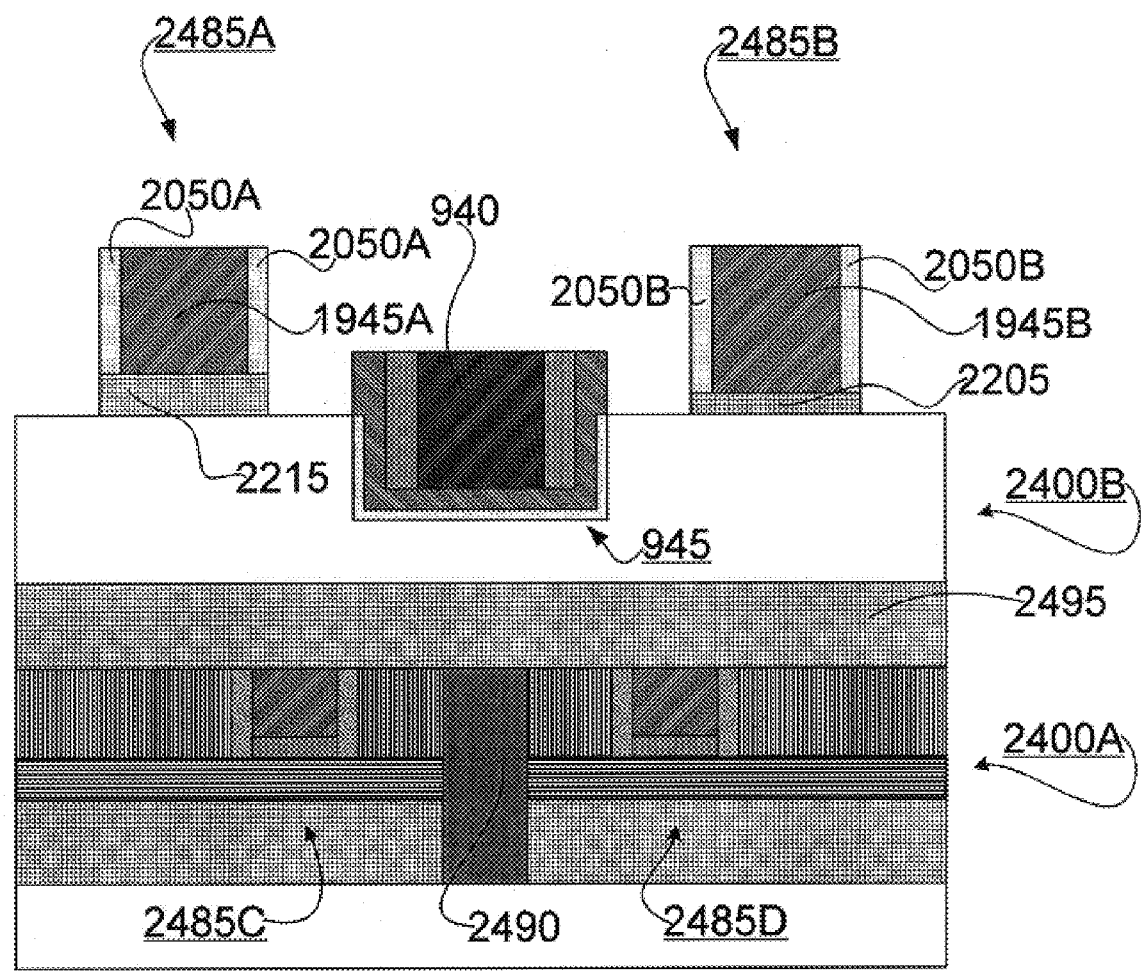
FIG. 24 illustrates schematically in cross-section yet another embodiment of a method for isolation structure fabrication according to the present invention.

As shown in FIG. 1, a first dielectric layer 105 may be formed above a structure 100 such as a semiconducting substrate. However, the present invention is not limited to the formation of an isolation structure above the surface of a semiconducting substrate such as a silicon wafer. Rather, as will be apparent to one skilled in the art upon a complete reading of the present disclosure, an isolation structure formed in accordance with the present invention may be formed above previously formed semiconductor devices, e.g., transistors, or other similar structure (not shown). In effect, the present invention may be used to form an isolation structure and transistors on top of previously formed transistors, as shown in FIGS. 23–24, for example.

The first dielectric layer 105 may be formed by a variety of known techniques for forming such layers, e.g., chemical vapor deposition (CVD), low-pressure CVD (LPCVD), plasma-enhanced CVD (PECVD), sputtering and physical vapor deposition (PVD), and the like, and may have an equivalent oxide thickness $t_{ox\text{-}eq}$ ranging from at least approximately 10–20 Å, for example. An equivalent oxide thickness $t_{ox\text{-}eq}$ may be defined to be the thickness t of a dielectric material (with a dielectric constant K) that would have a capacitance C that is approximately the same as the capacitance $C_{ox}$ that a thickness $t_{ox\text{-}eq}$ of silicon dioxide ($SiO_2$) would have. Since $SiO_2$ has a dielectric constant $K_{ox}$ of approximately 4, and since $C = K/t$ and $C_{ox} = K_{ox}/t_{ox\text{-}eq}$, then $t = K/C = K/C_{ox} = Kt_{ox\text{-}eq}/K_{ox} = Kt_{ox\text{-}eq}/4$, approximately. For example, if the first dielectric layer 105 were formed of silicon nitride ($Si_3N_4$) with a dielectric constant $K_{nitride}$ of approximately 8, then an equivalent oxide thickness $t_{ox\text{-}eq}$ ranging from approximately 10–20 Å would correspond to a nitride thickness $t_{ox\text{-}eq}$ ranging from approximately 20–40 Å.

Eventually, as described more fully below, portions of the first dielectric layer 105 will become gate dielectrics 1505A and 1505B (see FIG. 15) for respective transistors 2385A and 2385B (see FIG. 23), for example. The first dielectric layer 105 may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon nitride ($Si_3N_4$), silicon oxynitride ($Si_xO_yN_z$), and the like. The first dielectric layer 105 may be formed of any suitable "high dielectric constant" or "high K" material, where K is greater than or equal to about 8, such as a titanium oxide ($Ti_xO_y$, e.g., $TiO_2$), a tantalum oxide ($Ta_xO_y$, e.g., $Ta_2O_5$), a barium strontium titanate (BST, $BaTiO_3/SrTiO_3$), and the like. In one illustrative embodiment, the first dielectric layer 105 is comprised of silicon nitride ($Si_3N_4$) having a thickness $t_{nitride}$ of approximately 20 Å, which is formed by an LPCVD process for higher throughput.

In another illustrative embodiment, the first dielectric layer 105 may be formed of tantalum pentoxide ($Ta_2O_5$) with a dielectric constant $K_{TaO}$ of approximately 24. Then, using $t = K_{TaO}/C = K_{TaO}/C_{ox} = K_{TaO}t_{ox\text{-}eq}/K_{ox} = 24t_{ox\text{-}eq}/4$, approximately, an equivalent oxide thickness $t_{ox\text{-}eq}$ ranging from approximately 10–20 Å would correspond to a $Ta_2O_5$ thickness $t_{Tao}$ ranging from approximately 60–120 Å. Alternatively, in yet another illustrative embodiment, the first dielectric layer 105 may be formed of a barium strontium titanate (BST, $BaTiO_3/SrTiO_3$) with a dielectric constant $K_{BST}$ of approximately 250. Then, using $t = K_{BST}/C = K_{BST}/C_{ox} = K_{BST}t_{ox\text{-}eq}/K_{ox} = 250t_{ox\text{-}eq}/4$, approximately, an equivalent oxide thickness $t_{ox\text{-}eq}$ ranging from approximately 10–20 Å would correspond to a BST thickness $t_{BST}$ ranging from approximately 625–1250 Å.

The use of high K materials for the first dielectric layer 105 increases the total physical thickness of the first dielectric layer 105 as compared with the use of $SiO_2$, for example. Generally, the thicker the gate dielectric 1505A, 1505B, the harder it is for charge carriers such as electrons to tunnel quantum mechanically through the gate dielectric 1505A, 1505B, for example. Since high K materials have a higher dielectric constant than $SiO_2$ ($K_{ox}$=approximately 4), a thicker layer of high K material may have substantially the same capacitance C as an ultrathin layer (e.g., about 10 Å) of $SiO_2$. The increased thickness of the high K material leads to much less quantum mechanical tunneling through the high K material than through a thinner layer of $SiO_2$.

Figure 2:
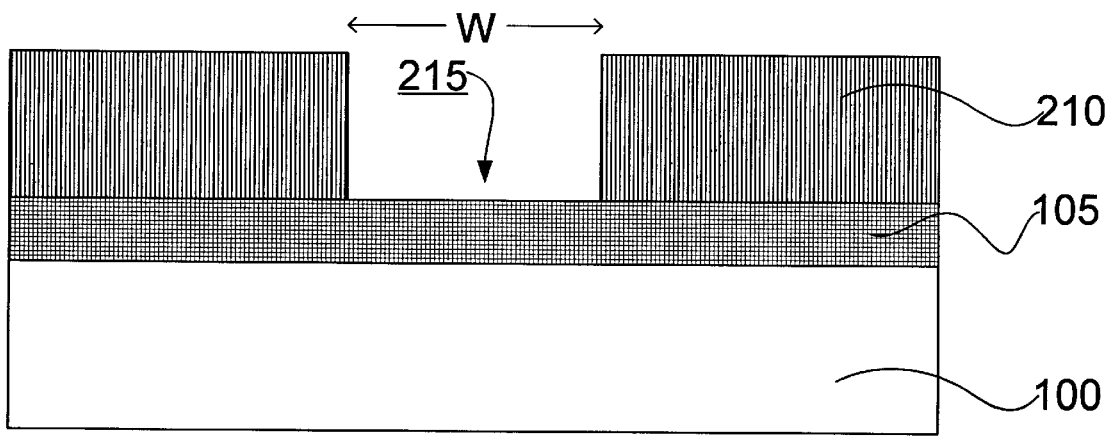
Figure 3:
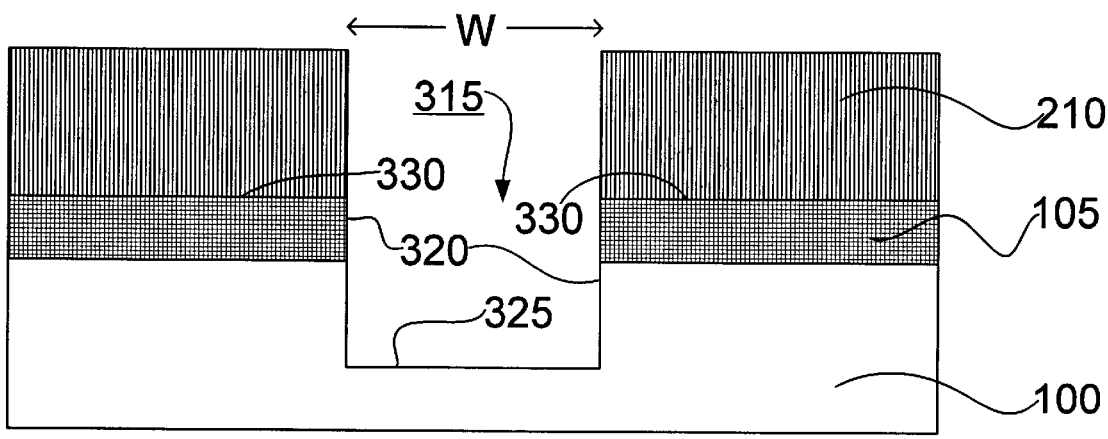
Figure 4:
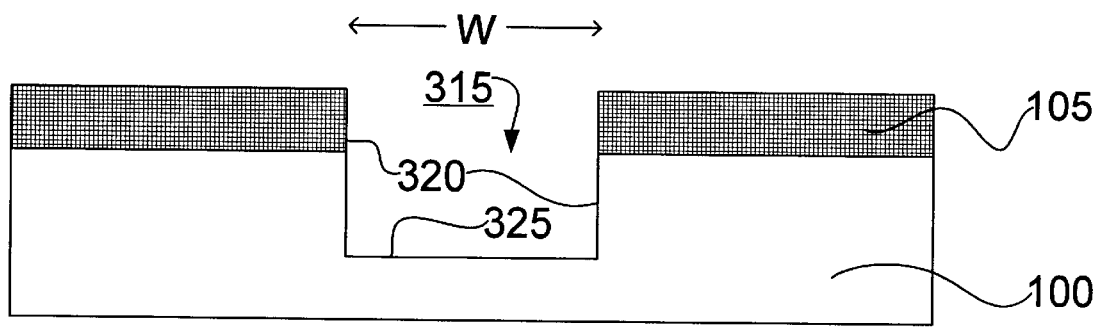

As shown in FIG. 2, a mask 210 of photoresist, for example, may be formed above the first dielectric layer 105 and may be patterned to define an opening 215. The mask 210 of photoresist may have a thickness ranging from approximately 10000–15000 Å(10 kÅ–15 kÅ), for example. As shown in FIGS. 2–3, using the mask 210 of photoresist, for example, the first dielectric layer 105 and the structure 100 may then be etched, forming an opening 315, having a bottom 325 and sidewalls 320. As shown in FIG. 4, the mask 210 of photoresist, for example, may then be removed by being stripped off.

As shown in FIGS. 2–4, the opening 315 may be formed using a variety of known photolithography and etching techniques, such as an anisotropic etching process using hydrogen bromide (HBr) and argon (Ar) as the etchant gases, for example. The opening 315 may have a width W that may be varied as a matter of design choice. For example, the width W of the opening 315 may range from approximately 1000–2000 Å. The opening 315 may also have a height from the bottom 325 of the opening 315 to an upper surface 330 of the first dielectric layer 105 that may be varied as a matter of design choice. For example, the height from the bottom 325 of the opening 315 to the upper surface 330 of the first dielectric layer 105 may range from approximately 300–1500 Å.

Figure 5:
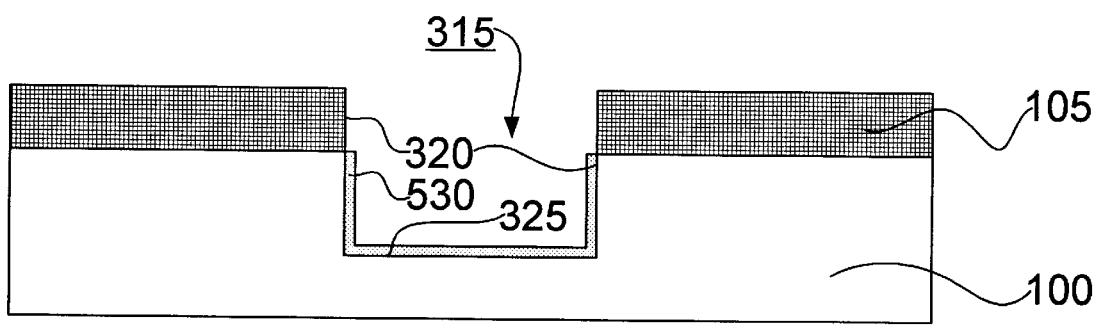

As shown in FIG. 5, a second dielectric layer 530 may be formed above the bottom 325 of the opening 315 and on portions of the sidewalls 320 of the opening 315 formed in the structure 100. The second dielectric layer 530 may be formed by a variety of known techniques for forming such a structure, including, but not limited to, thermal growing, CVD, PVD, LPCVD, PECVD, and the like, and may have a thickness ranging from approximately 5–10 Å, for example.

The second dielectric layer 530 may be formed by, for example, thermally growing a layer of dielectric material above the bottom 325 of the opening 315 and on the portions of the sidewalls 320 of the opening 315 formed in the structure 100. Note that the second dielectric layer 530 would not thermally grow on portions of the sidewalls 320 of the opening 315 formed in the first dielectric layer 105.

The second dielectric layer 530 may be formed from a variety of dielectric materials and may, for example, be an oxide (e.g., germanium oxide), a nitride (e.g., gallium arsenide nitride), an oxynitride (e.g., gallium phosphide oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon nitride ($Si_3N_4$), silicon oxynitride ($Si_xO_yN_z$), and the like. In one illustrative embodiment, the second dielectric layer 530 is comprised of a nitrogen-containing oxide, such as nitrous oxide (NO) $SiO_2$, for example, having a thickness of approximately 5 Å, which is thermally grown for higher throughput. Such an NO $SiO_2$ layer 530 may have approximately 4–6% molecular nitrogen ($N_2$) in the $SiO_2$, with silicon nitride ($Si_xN_y$) at the surface and with molecular ($N_2$) and/or atomic nitrogen (N) beneath the surface, for example.

Figure 6:
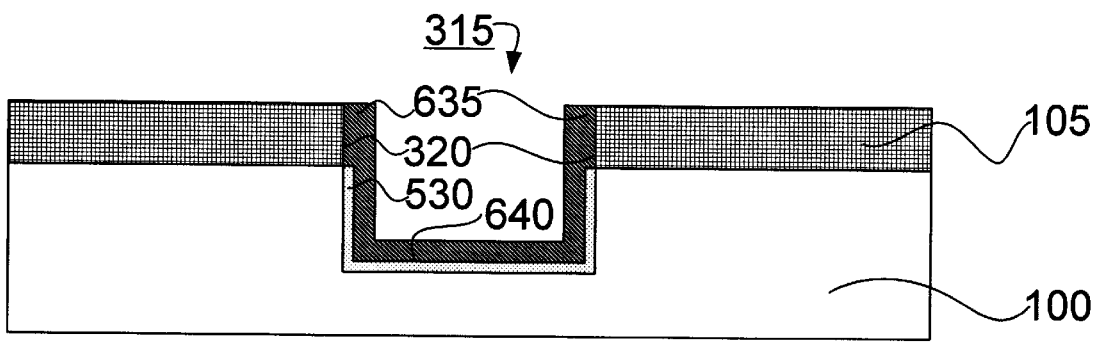

As shown in FIG. 6, a third dielectric layer 635 may be formed adjacent the second dielectric layer 530 and on the portions of the sidewalls 320 of the opening 315 formed in the first dielectric layer 105. The third dielectric layer 635 may be formed by a variety of known techniques for forming such layers, including, but not limited to, thermal growing, CVD, PVD, LPCVD, PECVD, and the like, and may have a thickness ranging from approximately 10–20 Å, for example. The third dielectric layer 635 may be formed from a variety of dielectric materials and may, for example, be an oxide (e.g, Ge oxide), a nitride (e.g., GaAs nitride), an oxynitride (e.g., GaP oxynitride), silicon dioxide ($SiO_2$), nitrogen-bearing $SiO_2$, silicon nitride ($Si_3N_4$), silicon oxynitride ($Si_xO_yN_z$), and the like. The second and third dielectric layers 530 and 635 may function as dual seal layers. In one illustrative embodiment, the third dielectric layer 635 is comprised of silicon nitride ($Si_3N_4$), having a thickness of approximately 10 Å, which is formed by a PECVD process for higher throughput.

The structure 100 and the first, second and third dielectric layers 105, 530 and 635, respectively, as shown in FIG. 6, may next be subjected to a heat-treating process to passivate bonds and reduce and/or eliminate charge-trapping. The heat-treating process may be performed by a variety of known techniques. For example, the heat-treating process may be a rapid thermal anneal (RTA) process performed at a temperature ranging from approximately 800–1050° C. for a time period ranging from approximately 5–30 seconds.

In one illustrative embodiment, an ammonia ($NH_3$) anneal ($NH_3$ RTA) may be performed at a temperature in a range of about 800–1050° C. for a time period in a range of about 5–30 seconds. The $NH_3$ RTA may be performed with a concentration of $NH_3$ (by volume and/or weight and/or gas flow rate) in a range of about 60–100% in an inert ambient that may include one or more of argon (Ar), nitrogen ($N_2$) and/or xenon (Xe), and the like. It is believed that unpassivated bonds and/or charge-trapping in the dielectric materials and/or at or near the interfaces between the various layers of materials may lead to undesirable variations in the voltage, capacitance and/or charging characteristics of the semiconductor devices containing such layers. This may be particularly the case for the third dielectric layer 635, and at or near an interface 640 between the second dielectric layer 530 and the third dielectric layer 635. Therefore, the passivation of bonds and the reduction and/or elimination of such charge-trapping may be advantageous.

Figure 7:
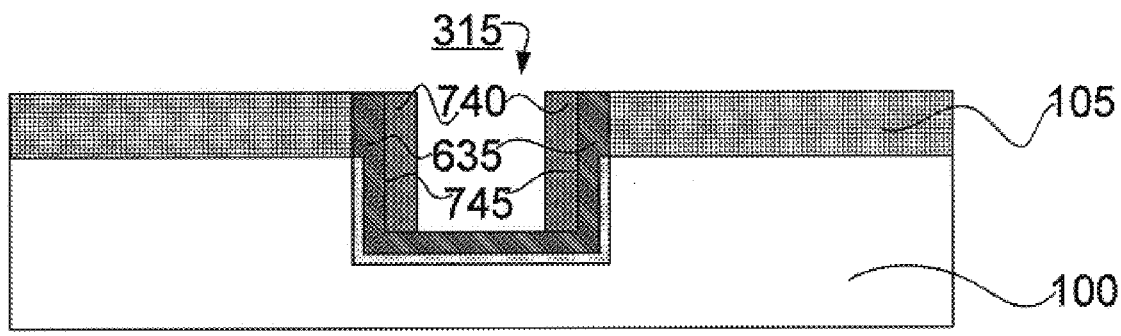

As shown in FIG. 7, dielectric spacers 740 may be formed within the opening 315 adjacent the third dielectric layer 635 by a variety of techniques. For example, the dielectric spacers 740 may be formed by depositing a layer of the appropriate material adjacent the third dielectric layer 635 and then performing an anisotropic reactive ion etching (RIE) process on the deposited layer. The dielectric spacers 740 may each have a base thickness (measured horizontally from sidewalls 745 of the third dielectric layer 635) ranging from approximately 300–500 Å, for example.

The dielectric spacers 740 may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), nitrogen-bearing $SiO_2$, silicon nitride ($Si_3N_4$), silicon oxynitride ($Si_xO_yN_z$), and the like. In one illustrative embodiment, the dielectric spacers 740 are comprised of $Si_3N_4$, having a base thickness of approximately 300 Å. Such dielectric spacers 740 comprised of $Si_3N_4$ are believed to provide resistance to penetration by implanted dopants and/or mobile impurities. Alternatively, the dielectric spacers 740 may be comprised of other appropriate materials that provide resistance to penetration by implanted dopants and/or mobile impurities.

Figure 8:
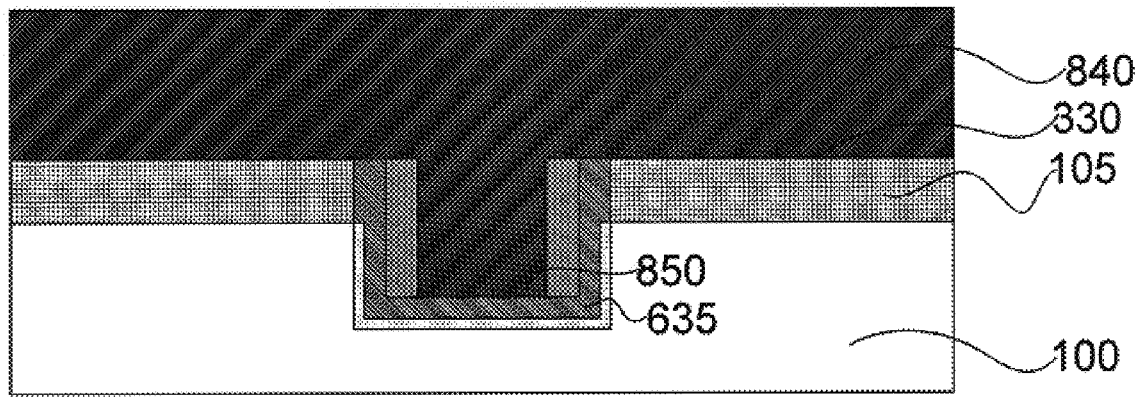
Figure 9:
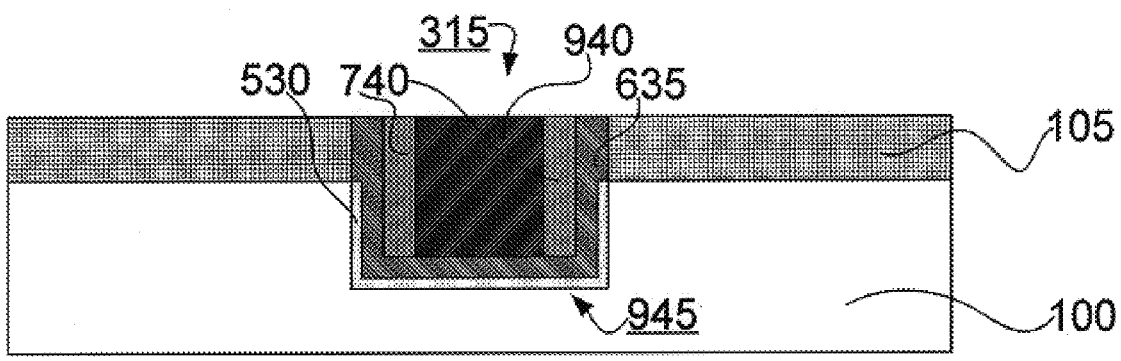

As shown in FIGS. 8–9, a dielectric filler 940 (see FIG. 9) may be formed within the opening 315 adjacent the dielectric spacers 740 and above the third dielectric layer 635. The dielectric filler 940 (see FIG. 9) may be formed by a variety of techniques. For example, the dielectric filler 940 (see FIG. 9) may be formed by depositing a dielectric filler layer 840 above the first dielectric layer 105 and within the opening 315 adjacent the dielectric spacers 740 and above the third dielectric layer 635. The dielectric filler layer 840 may have a thickness (measured from the upper surface 330 of the first dielectric layer 105) ranging from at least approximately 300–1500 Å, for example. The thickness of the dielectric filler layer 840 may be at least as great as the height from an upper surface 850 of the third dielectric layer 635 at the bottom of the opening 315 to the upper surface 330 of the first dielectric layer 105, for example.

The dielectric filler layer 840 may then be planarized, forming the dielectric filler 940 within the opening 315. The dielectric filler layer 840 may be planarized by polishing, for example. In particular, the dielectric filler layer 840 may be planarized by a chemical mechanical polishing (CMP) process, for example.

The dielectric filler layer 840 may be formed from a variety of dielectric materials and may, for example, be an oxide (e.g., Ge oxide), a nitride (e.g., GaAs nitride), an oxynitride (e.g., GaP oxynitride), silicon dioxide ($SiO_2$), nitrogen-bearing $SiO_2$, silicon nitride ($Si_3N_4$), silicon oxynitride ($Si_xO_yN_z$), and the like. In one illustrative embodiment, the dielectric filler layer 840 is comprised of tetraethyl orthosilicate (TEOS), also known as ethyl silicate, $(C_2H_5)_4SiO_4$, having a thickness of approximately 1000 Å.

An isolation structure 945, formed from the second dielectric layer 530, third dielectric layer 635, dielectric spacers 740 and the dielectric filler 940, may separate and electrically isolate semiconductor devices from each other. For example, in a CMOS device, the isolation structure 945 may be used to separate and electrically isolate the NMOS transistor from the PMOS transistor. The method of forming such a scaled-down isolation structure 945, as described above in various embodiments, according to the present invention, reduces and/or eliminates charge-trapping in the isolation structure 945. Furthermore, the method of forming such a scaled-down isolation structure 945, as described above in various embodiments, according to the present invention, also integrates the formation of the isolation structure 945 with the formation of the gate dielectrics 1505A and 1505B (see FIG. 15) for the respective transistors 2385A and 2385B (see FIG. 23), for example, and/or with the formation of gate dielectrics 2215 and 2205 (see FIG. 22) for the respective transistors 2485A and 2485B (see FIG. 24). Moreover, the isolation structure 945 may advantageously resist being affected by exposure during subsequent processing and this increases the reliability of the isolation structure 945 and of the semiconductor devices in which such an isolation structure 945 is contained.

Figure 10:
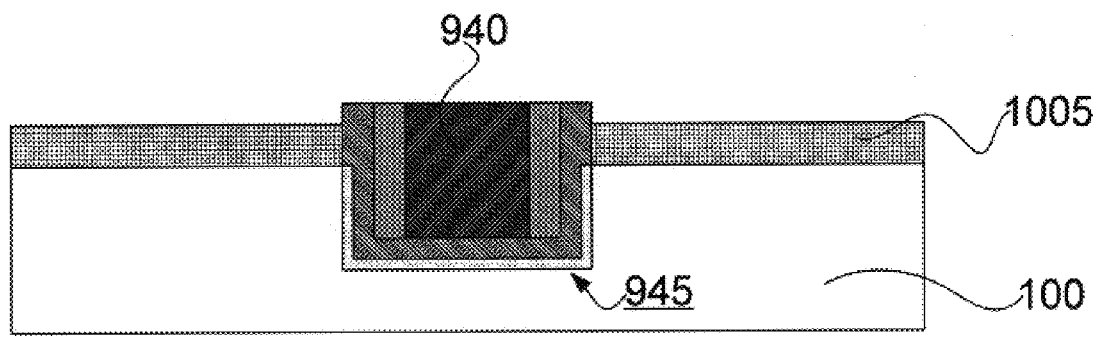

As shown in FIGS. 10–15, transistors such as transistors 2385A and 2385B (see FIG. 23), for example, may be formed on either side of the isolation structure 945 by a variety of techniques. As shown in FIG. 10, the first dielectric layer 105 (see FIGS. 1–9) may be reduced to a desired thickness to form the gate dielectric layer 1005. Portions of the gate dielectric layer 1005 may become the gate dielectrics 1505A and 1505B (see FIG. 15) for the respective transistors 2385A and 2385B (see FIG. 23).

The first dielectric layer 105 (see FIGS. 1–9) may be reduced, by selective isotropic etching, for example, so that the gate dielectric layer 1005 may have an equivalent oxide thickness $t_{ox\text{-}eq}$ ranging from approximately 10–20 Å, for example. Alternatively, the first dielectric layer 105 (see FIGS. 1–9) may already have an equivalent oxide thickness $t_{ox\text{-}eq}$ ranging from approximately 10–20 Å, for example, so that no separate act of reduction, by etching or otherwise, would have to be performed on the first dielectric layer 105 (see FIGS. 1–9) to form the gate dielectric layer 1005. In one illustrative embodiment, the gate dielectric layer 1005 may have an equivalent oxide thickness $t_{ox\text{-}eq}$ of approximately 15 Å, for example.

The semiconductor device may next be subjected to a heat-treating process. The heat-treating process may be performed by a variety of known techniques. For example, the heat-treating process may be performed in a traditional tube furnace at a temperature ranging from approximately 650–900° C. for a time period ranging from approximately 15–30 minutes in an inert ambient that may include one or more of argon (Ar), nitrogen (N$_2$) and/or xenon (Xe), and the like. In one illustrative embodiment, an anneal may be performed at a temperature of about 650° C. for a time period of about 15 minutes in an inert Ar ambient.

Figure 11:
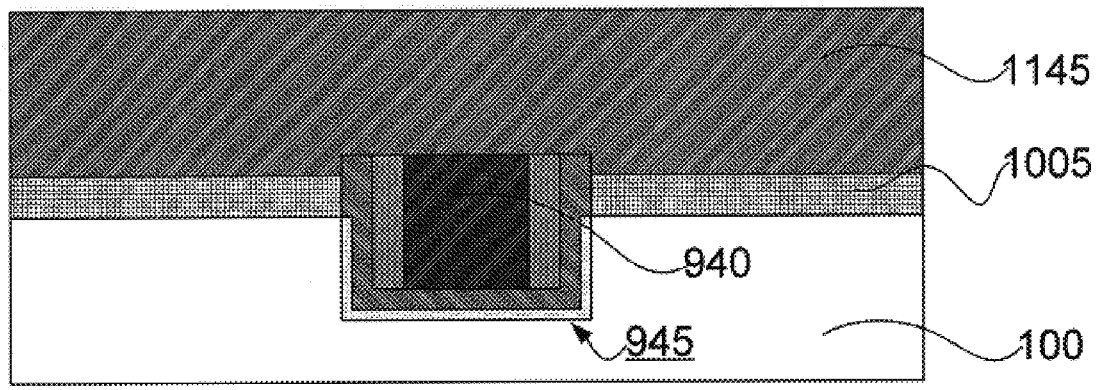
Figure 12:
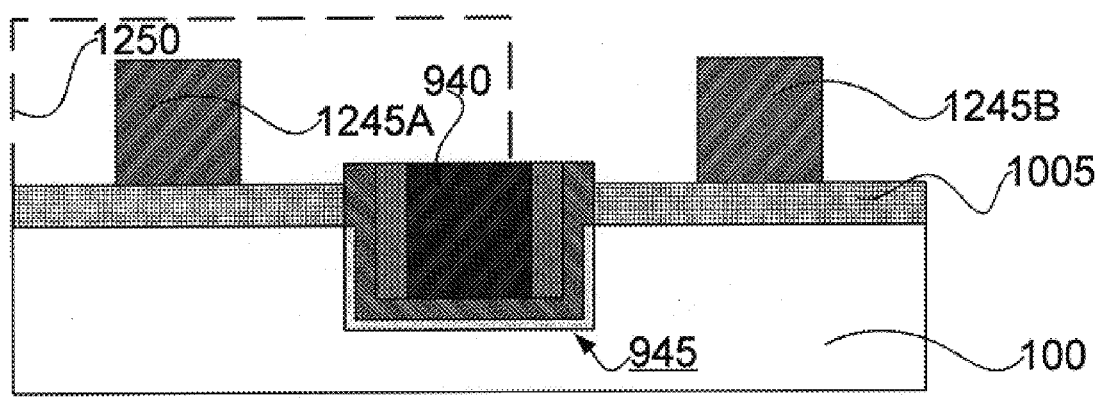

As shown in FIGS. 11 and 12, gate conductors 1245A and 1245B may be formed above the gate dielectric layer 1005. The gate conductors 1245A and 1245B may be formed by first forming a conductive layer 1145 above the isolation structure 945 and above the gate dielectric layer 1005, and then masking and etching the conductive layer 1145, for example. The conductive layer 1145 may be formed by a variety of known techniques for forming such layers, e.g., CVD or LPCVD, and may have a thickness ranging from approximately 1000–2000 Å. The gate conductors 1245A and 1245B may be formed using a variety of known photolithography and etching techniques, such as an anisotropic etching process using hydrogen bromide (HBr) and argon (Ar) as the etchant gases, for example. In one illustrative embodiment, the gate conductors 1245A and 1245B are comprised of doped polysilicon, having a thickness of approximately 1000 Å, which is formed by an LPCVD process for higher throughput.

The conductive layer 1145 may be formed of aluminum (Al), tungsten (W), tantalum (Ta), titanium (Ti), Cobalt (Co) or copper (Cu), and the like. Alternatively, the conductive layer 1145 may be formed of doped polysilicon that is then subjected to an anneal to render the doped polysilicon more conductive.

As shown in FIG. 12, the gate conductor 1245A may have a masking structure 1250 (shown in phantom) formed around it so that the gate conductor 1245B may be processed differently as compared to the gate conductor 1245A. Several masking structures, similar to the masking structure 1250 (shown in phantom), may be successively and/or alternately used around the gate conductors 1245A and 1245B to accomplish multiple differential processing actions, for example.

In the formation of a CMOS structure in one illustrative embodiment, for example, the doping for the lightly doped drain (LDD) N$^-$ regions of the NMOS transistor 2385A may be different than the doping for the lightly doped drain (LDD) P$^-$ regions of the PMOS transistor 2385B. A first masking structure 1250 (shown in phantom) would protect the gate conductor 1245A (and adjacent portions of the gate dielectric layer 1005 and the structure 100) from being doped by the dopant implantation(s) for the gate conductor 1245B (and adjacent portions of the dielectric layer 1005 and the structure 100). A second masking structure (not shown), similar to the first masking structure 1250 (shown in phantom), may then be formed around the gate conductor 1245B. Such a second masking structure would then protect the gate conductor 1245B (and adjacent portions of the dielectric layer 1005 and the structure 100) from being doped by the different dopant implantation(s) for the gate conductor 1245A (and adjacent portions of the dielectric layer 1005 and the structure 100).

Similarly, in the formation of a CMOS structure in another illustrative embodiment, the work functions of the gate conductors 1245A and 1245B for the NMOS and PMOS transistors 2385A, 2385B may be tuned by masking the gate conductor 1245A for the NMOS transistor 2385A, using the masking structure 1250 (shown in phantom), for example. The gate conductor 1245B for the corresponding PMOS transistor 2385B may then be etched away without affecting the masked original gate conductor 1245A for the NMOS transistor 2385A. The original gate conductor 1245B for the PMOS transistor 2385B may then be replaced with a gate conductor 1245B formed of a material, such as Cu, that is different from the material used to form the original gate conductors 1245A and 1245B. The replacement Cu gate conductor 1245B for the PMOS transistor 2385B may then be polished, for example, without affecting the masked original gate conductor 1245A for the NMOS transistor 2385A.

Figure 13:
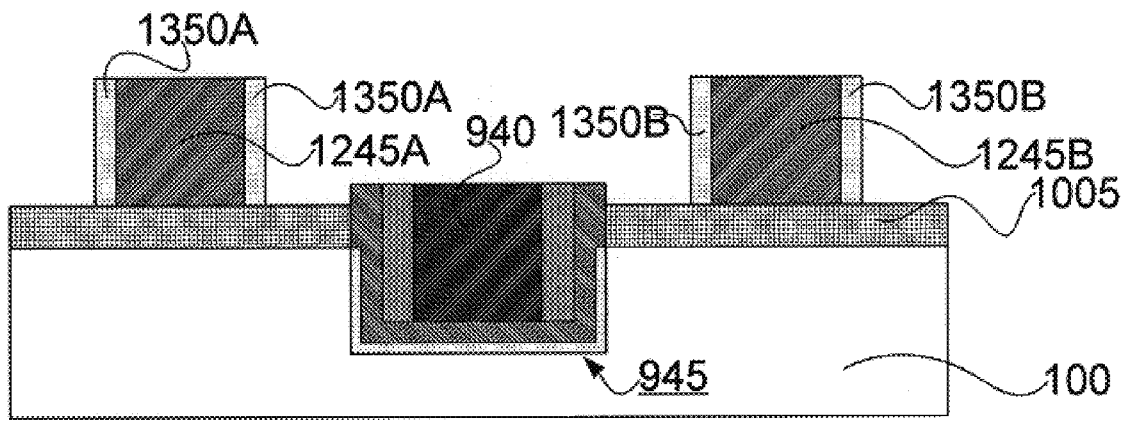

As shown in FIG. 13, transistor dielectric spacers 1350A and 1350B may be formed on sides of the respective gate conductors 1245A and 1245B by a variety of techniques. For example, the transistor dielectric spacers 1350A and 1350B may be formed by depositing a conformal layer of the appropriate material above and adjacent the gate conductors 1245A and 1245B and then performing an anisotropic reactive ion etching (RIE) process on the conformally blanket-deposited layer. Alternatively, in other illustrative embodiments, the transistor dielectric spacers 1350A and 1350B may be formed by being selectively thermally grown on the sides of the polysilicon gate conductors 1245A and 1245B, respectively, since SiO$_2$ may thermally grow on any surface where silicon (Si) may be exposed. The transistor dielectric spacers 1350A and 1350B may each have a base thickness (measured horizontally from the sides of the gate conductors 1245A and 1245B) ranging from approximately 150–600 Å, for example.

The transistor dielectric spacers 1350A and 1350B may be formed from a variety of dielectric materials and may, for example, be oxides (e.g., Ge oxide), nitrides (e.g., GaAs nitride), oxynitrides (e.g., GaP oxynitride), silicon dioxides (SiO$_2$), nitrogen-bearing SiO$_2$, silicon nitrides (Si$_3$N$_4$), silicon oxynitrides (Si$_x$O$_y$N$_z$), and the like. In one illustrative embodiment, the transistor dielectric spacers 1350A and 1350B are comprised of SiO$_2$, having a base thickness of approximately 150 Å. In another illustrative embodiment, using the masking structure 1250 (see FIG. 12), the transistor dielectric spacers 1350A are formed to be comprised of SiO$_2$, having a base thickness of approximately 200 Å, and the transistor dielectric spacers 1350B are formed to be comprised of Si$_3$N$_4$, having a base thickness of approximately 400 Å.

Figure 14:
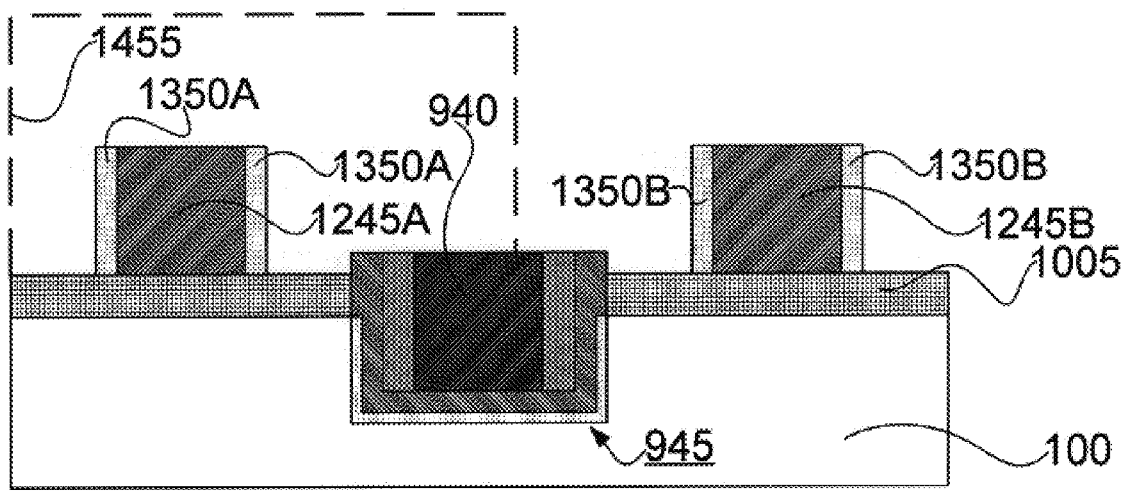

As shown in FIG. 14, the gate conductor 1245A insulated by the dielectric spacers 1350A may have a masking structure 1455 (shown in phantom) formed around it so that the gate conductor 1245B insulated by the dielectric spacers 1350B may be processed differently. Several masking structures, similar to the masking structure 1455 (shown in phantom), may be successively and/or alternately used around the insulated gate conductors 1245A and 1245B to accomplish multiple differential processing actions, for example.

In the formation of a CMOS structure in one illustrative embodiment, for example, the doping for the heavily doped N+ source/drain regions of the NMOS transistor 2385A may be different than the doping for the heavily doped P+ source/drain regions of the PMOS transistor 2385B. A first masking structure 1455 (shown in phantom) would then protect the insulated gate conductor 1245A (and adjacent portions of the gate dielectric layer 1005 and the structure 100) from being doped by the dopant implantation(s) for the insulated gate conductor 1245B (and adjacent portions of the dielectric layer 1005 and the structure 100). A second masking structure (not shown), similar to the first masking structure 1455 (shown in phantom), may then be formed around the insulated gate conductor 1245B. Such a second masking structure would then protect the insulated gate conductor 1245B (and adjacent portions of the dielectric layer 1005 and the structure 100) from being doped by the different dopant implantation(s) for the insulated gate conductor 1245A (and adjacent portions of the dielectric layer 1005 and the structure 100).

Figure 15:
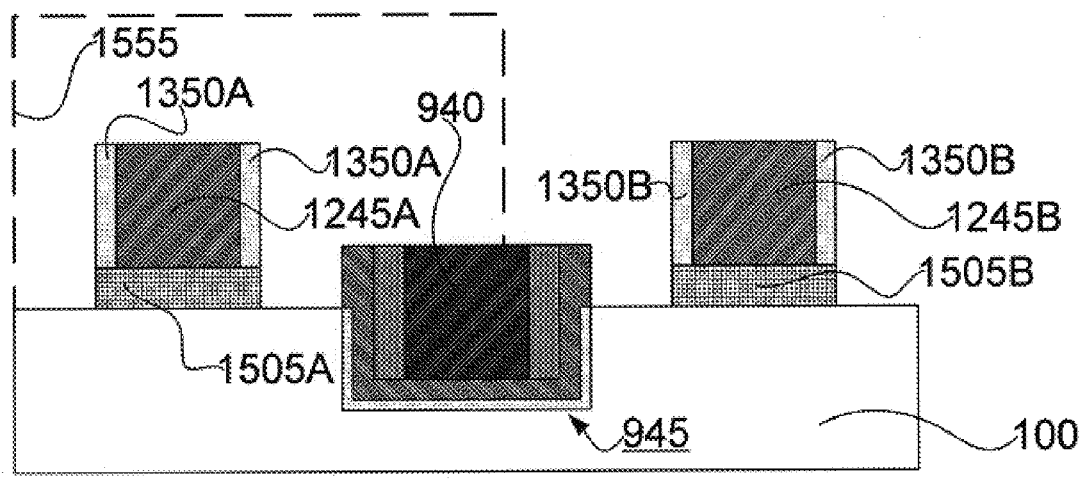

As shown in FIG. 15, gate dielectrics 1505A and 1505B may be formed by removing portions of the gate dielectric layer 1005 (see FIGS. 10–14) that are not underlying the respective gate conductors 1245A and 1245B and the respective transistor dielectric spacers 1350A and 1350B. Portions of the gate dielectric layer 1005 may be removed by etching, for example. The etching used to remove portions of the gate dielectric layer 1005 may be anisotropic, such as reactive ion etching (RIE), for example. Alternatively, the etching used to remove portions of the gate dielectric layer 1005 may be isotropic, using the selective etchability of the portions of the gate dielectric layer 1005 relative to the transistor dielectric spacers 1350A and 1350B and the isolation structure 945, for example. The etch may be a plasma or dry etch, or, alternatively, a wet chemical etch. As an example of a wet chemical etch, a 10:1 hydrogen fluoride (HF)/water (H$_2$O) solution may be used.

As shown in FIG. 15, the gate conductor 1245A insulated by dielectric spacers 1350A above the gate dielectric 1505A may have a masking structure 1555 (shown in phantom) formed around it so that the gate conductor 1245B insulated by the dielectric spacers 1350B above the gate dielectric 1505B may be processed differently to form the transistors 2385A and 2385B (see FIG. 23), for example. Several masking structures, similar to the masking structure 1555 (shown in phantom), may be successively and/or alternately used around the insulated gate conductors 1245A and 1245B above the respective gate dielectrics 1505A and 1505B to accomplish multiple differential processing actions, for example, as described above in illustrating the masking structures 1250 and 1455 (see FIGS. 12 and 14, respectively).

As shown in FIGS. 10 and 16–22, transistors such as transistors 2485A and 2485B (see FIG. 24) may be formed on either side of the isolation structure 945 by a variety of techniques. As shown in FIG. 10, the first dielectric layer 105 (see FIGS. 1–9) may be reduced to a desired thickness to form the gate dielectric layer 1005. A portion of the gate dielectric layer 1005 may become the gate dielectric 2215 (see FIG. 22) for the transistor 2485A (see FIG. 24), for example.

The first dielectric layer 105 (see FIGS. 1–9) may be reduced, by selective isotropic etching, for example, so that the gate dielectric layer 1005 may have an equivalent oxide thickness $t_{ox\text{-}eq}$ ranging from approximately 10–20 Å, for example. Alternatively, the first dielectric layer 105 (see FIGS. 1–9) may already have an equivalent oxide thickness $t_{ox\text{-}eq}$ ranging from approximately 10–20 Å, for example, so that no separate act of reduction, by etching or otherwise, would have to be performed on the first dielectric layer 105 (see FIGS. 1–9) in order to form the gate dielectric layer 1005. In one illustrative embodiment, the gate dielectric layer 1005 may have an equivalent oxide thickness $t_{ox\text{-}eq}$ of approximately 20 Å, for example.

Figure 16:
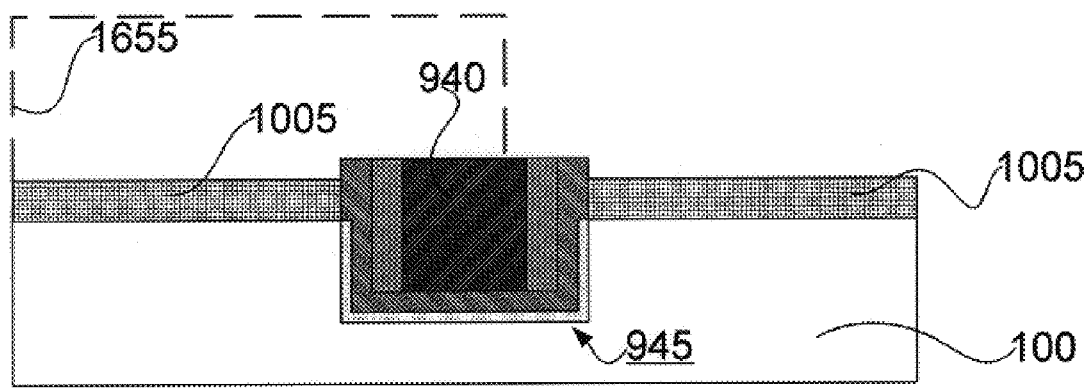
FIGS. 16–22 illustrate schematically in cross-section various alternative embodiments of a method for isolation structure fabrication according to the present invention.
Figure 17:
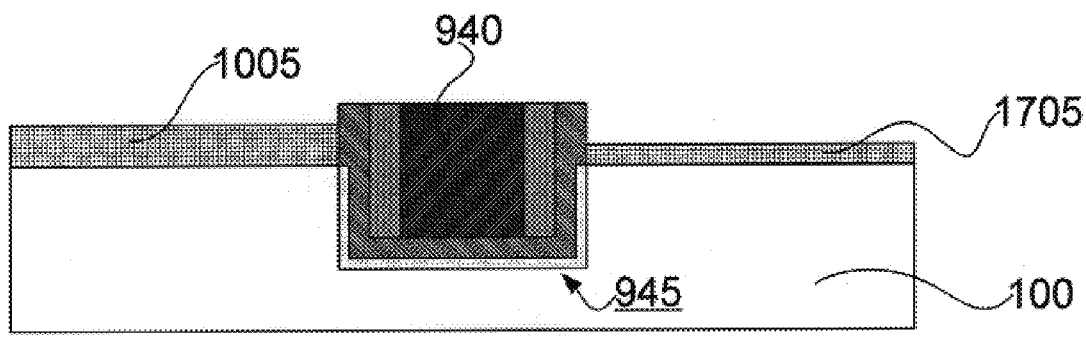

As shown in FIGS. 16–17, a portion of the reduced first dielectric layer 1005 may be further reduced to another desired thickness to form a gate dielectric layer 1705. A portion of the gate dielectric layer 1705 may become the gate dielectric 2205 (see FIG. 22) for the transistor 2485B (see FIG. 24), for example. A masking structure 1655 may be used to protect the remaining portion of the reduced first dielectric layer 1005 from being further reduced in thickness. The unmasked, reduced first dielectric layer 1005 (see FIG. 10) may be further reduced, by selective isotropic etching, for example, so that the gate dielectric layer 1705 may have an equivalent oxide thickness $t_{ox\text{-}eq}$ ranging from approximately 10–20 Å, for example. In one illustrative embodiment, the gate dielectric layer 1705 may have an equivalent oxide thickness $t_{ox\text{-}eq}$ of approximately 10 Å, while the gate dielectric layer 1005 may have an equivalent oxide thickness $t_{ox\text{-}eq}$ of approximately 20 Å.

The semiconductor device may next be subjected to a heat-treating process. The heat-treating process may be performed by a variety of known techniques. For example, the heat-treating process may be performed in a traditional tube furnace at a temperature ranging from approximately 650–900° C. for a time period ranging from approximately 15–30 minutes in an inert ambient that may include one or more of argon (Ar), nitrogen (N$_2$) and/or xenon (Xe), and the like. In one illustrative embodiment, an anneal may be performed at a temperature of about 650° C. for a time period of about 15 minutes in an inert Ar ambient.

Figure 18:
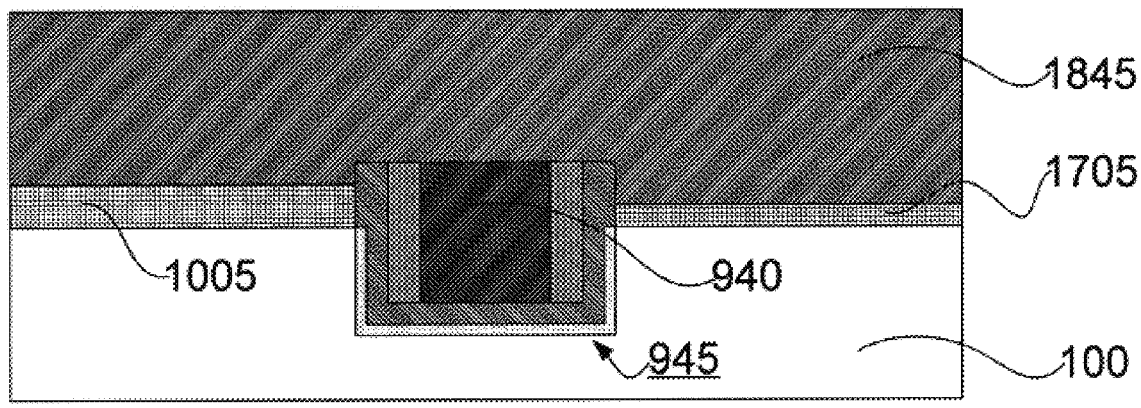
Figure 19:
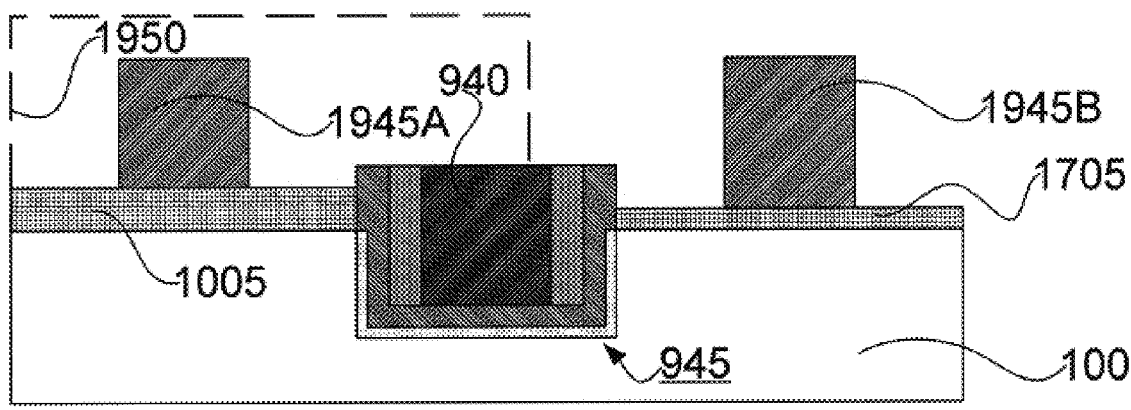

As shown in FIGS. 18 and 19, gate conductors 1945A and 1945B may be formed above the gate dielectric layers 1005 and 1705. The gate conductors 1945A and 1945B may be formed by first forming a conductive layer 1845 above the isolation structure 945 and above the gate dielectric layers 1005 and 1705, and then masking and etching the conductive layer 1845, for example. The conductive layer 1845 may be formed by a variety of known techniques for forming such layers, e.g., CVD or LPCVD, and may have a thickness ranging from approximately 1000–2000 Å. The gate conductors 1945A and 1945B may be formed using a variety of known photolithography and etching techniques, such as an anisotropic etching process using hydrogen bromide (HBr) and argon (Ar) as the etchant gases, for example. In one illustrative embodiment, the gate conductor 1945 is comprised of doped polysilicon, having a thickness of approximately 1000 Å, which is formed by an LPCVD process for higher throughput.

The conductive layer 1845 may be formed of aluminum (Al), tungsten (W), tantalum (Ta), titanium (Ti), Cobalt (Co) or copper (Cu), and the like. Alternatively, the conductive layer 1845 may be formed of doped polysilicon that is then subjected to an anneal to render the doped polysilicon more conductive.

As shown in FIG. 19, the gate conductor 1945A may have a masking structure 1950 (shown in phantom) formed around it so that the gate conductor 1945B may be processed differently as compared tot he gate conductor 1945A. Several masking structures, similar to the masking structure 1950 (shown in phantom), may be successively and/or alternately used around the gate conductors 1945A and 1945B to accomplish multiple differential processing actions, for example.

In the formation of a CMOS structure in one illustrative embodiment, for example, the doping for the lightly doped drain (LDD) N$^-$ regions of the NMOS transistor 2485A may be different than the doping for the lightly doped drain (LDD) P$^-$ regions of the PMOS transistor 2485B. A first masking structure 1950 (shown in phantom) would protect the gate conductor 1245A (and adjacent portions of the gate dielectric layer 1005 and the structure 100) from being doped by the dopant implantation(s) for the gate conductor 1945B (and adjacent portions of the dielectric layer 1705 and the structure 100). A second masking structure (not shown), similar to the first masking structure 1950 (shown in phantom), may then be formed around the gate conductor 1945B. Such a second masking structure would then protect the gate conductor 1945B (and adjacent portions of the dielectric layer 1705 and the structure 100) from being doped by the different dopant implantation(s) for the gate conductor 1945A (and adjacent portions of the dielectric layer 1005 and the structure 100).

Similarly, in the formation of a CMOS structure in another illustrative embodiment, the work functions of the gate conductors 1945A and 1945B for the NMOS and PMOS transistors 2485A, 2485B may be tuned by masking the gate conductor 1945A for the NMOS transistor 2485A, using the masking structure 1950 (shown in phantom), for example. The gate conductor 1945B for the corresponding PMOS transistor 2485B may then be etched away without affecting the masked original gate conductor 1945A for the NMOS transistor 2485A. The original gate conductor 1945B for the PMOS transistor 2485B may then be replaced with a gate conductor 1945B formed of a material such as Cu that is different from the material used to form the original gate conductors 1945A and 1945B. The replacement Cu gate conductor 1945B for the PMOS transistor 2485B may then be polished, for example, without affecting the masked original gate conductor 1945A for the NMOS transistor 2485A.

Figure 20:
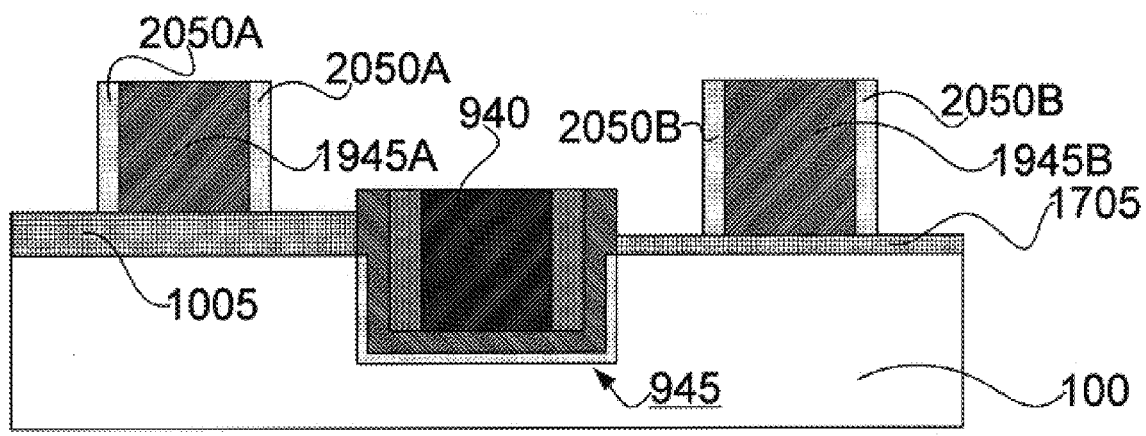

As shown in FIG. 20, transistor dielectric spacers 2050A and 2050B may be formed on sides of the gate conductors 1945A and 1945B by a variety of techniques. For example, the transistor dielectric spacers 2050A and 2050B may be formed by depositing a conformal layer of the appropriate material above and adjacent the gate conductors 1945A and 1945B and then performing an anisotropic reactive ion etching (RIE) process on the conformally blanket-deposited layer. Alternatively, in other illustrative embodiments, the transistor dielectric spacers 2050A and 2050B may be formed by being selectively thermally grown on the sides of the polysilicon gate conductors 1945A and 1945B, respectively, since $SiO_2$ may thermally grow on any surface where silicon (Si) may be exposed. The transistor dielectric spacers 2050A and 2050B may each have a base thickness (measured horizontally from the sides of the gate conductors 1945A and 1945B) ranging from approximately 150–600 Å, for example.

The transistor dielectric spacers 2050A and 2050B may be formed from a variety of dielectric materials and may, for example, be oxides (e.g., Ge oxide), nitrides (e.g., GaAs nitride), oxynitrides (e.g, GaP oxynitride), silicon dioxides ($SiO_2$), nitrogen-bearing $SiO_2$, silicon nitrides ($Si_3N_4$), silicon oxynitrides ($Si_xO_yN_z$), and the like. In one illustrative embodiment, the transistor dielectric spacers 2050A and 2050B are comprised of $SiO_2$, having a base thickness of approximately 150 Å. In another illustrative embodiment, using the masking structure 1950 (see FIG. 19), the transistor dielectric spacers 2050B are formed to be comprised of $SiO_2$, having a base thickness of approximately 200 Å, and the transistor dielectric spacers 2050A are formed to be comprised of $Si_3N_4$, having a base thickness of approximately 400 Å.

Figure 21:
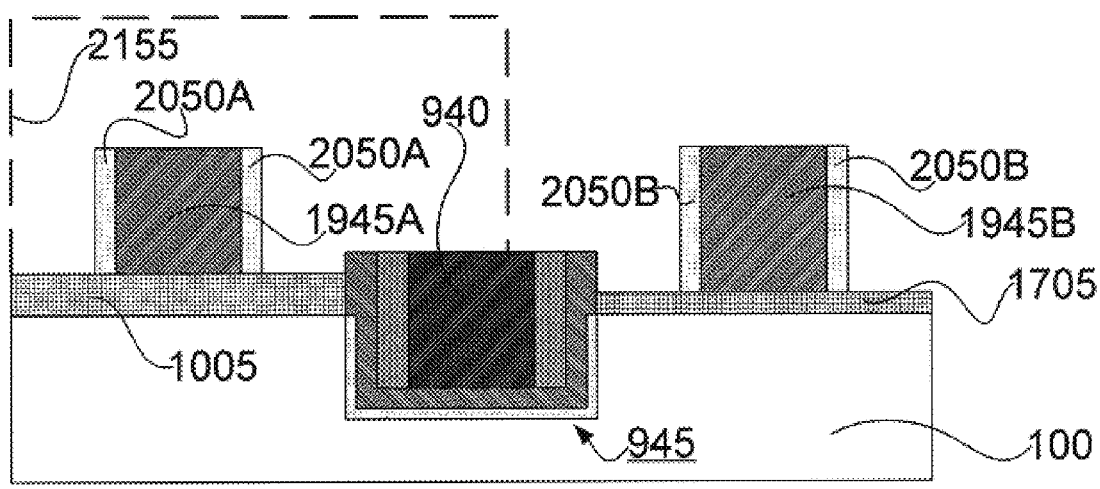

As shown in FIG. 21, the gate conductor 1945A insulated by the dielectric spacers 2050A may have a masking structure 2155 (shown in phantom) formed around it so that the gate conductor 1945B insulated by the dielectric spacers 2050B may be processed differently. Several masking structures, similar to the masking structure 2155 (shown in phantom), may be successively and/or alternately used around the insulated gate conductors 1945A and 1945B to accomplish multiple differential processing actions, for example.

In the formation of a CMOS structure in one illustrative embodiment, for example, the doping for the heavily doped N$^+$ source/drain regions of the NMOS transistor 2485A may be different than the doping for the heavily doped P$^+$ source/drain regions of the PMOS transistor 2485B. A first masking structure 2155 (shown in phantom) would protect the insulated gate conductor 1945A (and adjacent portions of the gate dielectric layer 1005 and the structure 100) from being doped by the dopant implantation(s) for the insulated gate conductor 1945B (and adjacent portions of the dielectric layer 1705 and the structure 100). A second masking structure (not shown), similar to the first masking structure 2155 (shown in phantom), may then be formed around the insulated gate conductors 1945B. Such a second masking structure would then protect the insulated gate conductors 1945B (and adjacent portions of the dielectric layer 1705 and the structure 100) from being doped by the different dopant implantation(s) for the insulated gate conductors 1945A (and adjacent portions of the dielectric layer 1005 and the structure 100).

Figure 22:
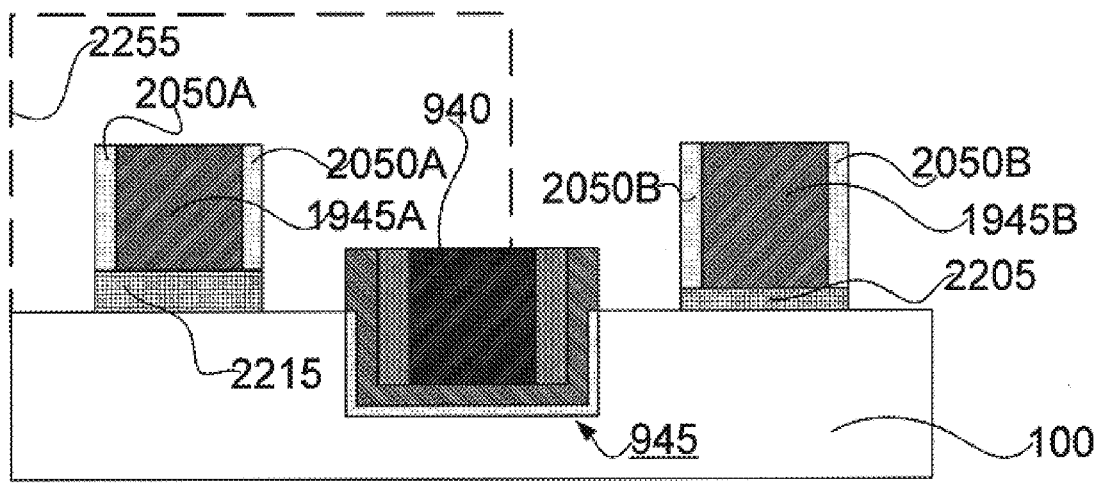

As shown in FIG. 22, a gate dielectric 2215 may be formed by removing portions of the gate dielectric layer 1005 (see FIGS. 10, 16–21) that are not underlying the gate conductor 1945A and the transistor dielectric spacers 2050A. Similarly, a gate dielectric 2205 may be formed by removing portions of the gate dielectric layer 1705 (see FIGS. 17–21) that are not underlying the gate conductor 1945B and the transistor dielectric spacers 2050B. Portions of the gate dielectric layers 1005 and 1705 may be removed by etching, for example. The etching used to remove portions of the gate dielectric layers 1005 and 1705 may be anisotropic, such as reactive ion etching (RIE), for example. Alternatively, the etching used to remove portions of the gate dielectric layers 1005 and 1705 may be isotropic, using the selective etchability of the portions of the gate dielectric layers 1005 and 1705 relative to the transistor dielectric spacers 2050A and 2050B and the isolation structure 945, for example. The etch may be a plasma or dry etch, or, alternatively, a wet chemical etch. As an example of a wet chemical etch, a 10:1 hydrogen fluoride (HF)/water ($H_2O$) solution may be used.

As shown in FIG. 22, the gate conductor 1945A insulated by dielectric spacers 2050A above the gate dielectric 2215 may have a masking structure 2255 (shown in phantom) formed around it so that the gate conductor 1945B insulated by the dielectric spacers 2050B above the gate dielectric 2205 may be processed differently to form the transistors 2485A and 2485B (see FIG. 24), for example. Several masking structures, similar to the masking structure 2255 (shown in phantom), may be successively and/or alternately used around the insulated gate conductor 1945A above the gate dielectric 2215 to accomplish multiple differential processing actions, for example, as described above in illustrating the masking structures 1950 and 2155 (see FIGS. 19 and 21, respectively).

As stated previously, the present invention may be used to form a plurality of transistors above other previously formed transistors, i.e., the present invention may be used to form multiple layers of transistors. For example, as shown in FIGS. 23 and 24, semiconductor devices, such as respective MOS structures 2300B and 2400B, similar to the MOS structures as shown in FIGS. 15 and 22, respectively, are formed above other semiconductor devices, such as respective CMOS structures 2300A and 2400A. As shown in FIGS. 23 and 24, the respective CMOS structures 2300A and 2400A are examples of structures 100 as shown in FIGS. 1–22.

The transistors 2385A, 2385B, 2485A and 2485B in the respective MOS structures 2300B and 2400B may be NMOS or PMOS. If the transistors 2385A and 2485A in the respective MOS structures 2300B and 2400B are both NMOS and the transistors 2385B and 2485B in the respective MOS structures 2300B and 2400B are both PMOS, then the respective MOS structures 2300B and 2400B would each be CMOS structures. Similarly, the transistors 2385C and 2485C in the respective CMOS structures 2300A and 2400A may both be NMOS and the transistors 2385D and 2485D in the respective CMOS structures 2300A and 2400A may both be PMOS.

The transistors 2385A and 2485A in the respective MOS structures 2300B and 2400B are each separated from the transistors 2385B and 2485B in the respective MOS structures 2300B and 2400B by the trench isolation structure 945. Similarly, the transistors 2385C and 2485C in the respective CMOS structures 2300A and 2400A are separated from the transistors 2385D and 2485D in the respective CMOS structures 2300A and 2400A by the respective trench isolation dielectric structures 2390 and 2490. The respective dielectric layers 2395 and 2495 separate and isolate the MOS structures 2300B and 2400B from the CMOS structures 2300A and 2400A.

Any of the above-disclosed embodiments of a method for fabricating an isolation structure according to the present invention provides for increased operating speed and performance of the transistors and/or other semiconductor devices. Additionally, the above-disclosed embodiments of methods for isolation structure fabrication according to the present invention enable transistor and/or other semiconductor device fabrication with increased device density and precision and enable a streamlined and simplified process flow, thereby decreasing the complexity and lowering the costs of the manufacturing process and increasing throughput.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for fabricating an isolation structure, the method comprising:

forming a first dielectric layer above a structure;

forming an opening in the first dielectric layer and the structure, the opening having sidewalls and a bottom;

forming a second dielectric layer within the opening on a first portion of the sidewalls and above the bottom of the opening;

forming a third dielectric layer within the opening adjacent the second dielectric layer and on a second portion of the sidewalls of the opening;

passivating bonds in the third dielectric layer to reduce charge-trapping in the third dielectric layer;

forming dielectric spacers within the opening adjacent the third dielectric layer; and forming a dielectric filler within the opening adjacent the dielectric spacers and above the third dielectric layer.

2. The method of claim 1, wherein forming the first dielectric layer comprises forming the first dielectric layer from a dielectric material having a dielectric constant K of at least about 8.

3. The method of claim 1, wherein the first and third dielectric layers are formed by deposition and the second dielectric layer is formed by being grown.

4. The method of claim 1, wherein forming the second dielectric layer comprises forming the second dielectric layer from a nitrogen-containing oxide.

5. The method of claim 4, wherein forming the second dielectric layer comprises forming the second dielectric layer from a nitrous oxide-containing silicon oxide.

6. The method of claim 1, wherein forming the third dielectric layer comprises forming the third dielectric layer from a nitride.

7. The method of claim 6, wherein forming the third dielectric layer from a nitride comprises forming the third dielectric layer from a silicon nitride.

8. The method of claim 1, wherein the passivation of the bonds in the third dielectric layer to reduce charge-trapping in the third dielectric layer includes an ammonia anneal.

9. The method of claim 1, wherein forming the dielectric spacers comprises forming the dielectric spacers from a nitride.

10. The method of claim 1, wherein forming the dielectric filler comprises forming the dielectric filler from tetraethyl orthosilicate (TEOS).

11. A method for fabricating an isolation structure, the method comprising:

depositing a first dielectric layer above a substrate layer;

etching a n opening in the first dielectric layer and the substrate layer, the opening having sidewalls and a bottom;

growing a second dielectric layer within the opening on a first portion of the sidewalls and above the bottom of the opening;

depositing a third dielectric layer within the opening adjacent the second dielectric layer and on a second portion of the sidewalls of the opening;

passivating bonds in the third dielectric layer to reduce charge-trapping in the third dielectric layer;

forming dielectric spacers within the opening adjacent the third dielectric layer; and depositing a dielectric filler within the opening adjacent the dielectric spacers and above the third dielectric layer.

12. The method of claim 11, wherein depositing the first dielectric layer comprises depositing a dielectric material having a dielectric constant K of at least about 8.

13. The method of claim 11, wherein growing the second dielectric layer comprises growing a nitrogen-containing oxide.

14. The method of claim 11, wherein depositing the third dielectric layer comprises depositing a first nitride, forming the dielectric spacers comprises forming the dielectric spacers from one of the first nitride and a second nitride, and depositing the dielectric filler comprises depositing tetraethyl orthosilicate (TEOS).

15. The method of claim 11, wherein the passivation of the bonds in the third dielectric layer to reduce charge-trapping in the third dielectric layer includes an ammonia anneal.

16. A method for MOSFET fabrication, the method comprising:

depositing a first dielectric layer above a substrate layer, the first dielectric layer having an equivalent oxide thickness in a range of at least about 10 Å–20 Å;

etching an opening in the first dielectric layer and the substrate layer, the opening having sidewalls and a bottom, the opening having a height above the bottom in a range of about 300 Å–1500 Å;

growing a second dielectric layer within the opening on a first portion of the sidewalls and above the bottom of the opening, the second dielectric layer having a thickness in a range of about 5 Å–10 Å;

depositing a third dielectric layer within the opening adjacent the second dielectric layer and on a second portion of the sidewalls of the opening, the third dielectric layer having a thickness in a range of about 10 Å–20 Å;

passivating bonds in the third dielectric layer using an ammonia anneal to reduce charge-trapping in the third dielectric layer;

forming dielectric spacers within the opening adjacent the third dielectric layer, the dielectric spacers having a base thickness in a range of about 300 Å–500 Å; and depositing a dielectric filler within the opening adjacent the dielectric spacers and above the third dielectric layer.

17. The method of claim 16, the method further comprising:

polishing the dielectric filler;

reducing at least a portion of the first dielectric layer to an equivalent oxide thickness in a range of about 10 Å–20 Å; and performing an anneal at a temperature in a range of about 650–900° C. in an inert ambient comprising one of argon, nitrogen and xenon for a time period in a range of about 15–30 minutes, wherein the formation of the dielectric spacers includes etching and the passivation of the bonds in the third dielectric layer using the ammonia anneal to reduce charge-trapping in the third dielectric layer further includes performing the ammonia anneal at a temperature in a range of about 800–1050° C. with a concentration of ammonia in a range of about 60–100% in an inert ambient comprising one of argon, nitrogen and xenon for a time period in a range of about 5–30 seconds.

18. The method of claim 16, wherein depositing the first dielectric layer includes depositing a dielectric material having a dielectric constant K>8, growing the second dielectric layer includes growing a nitrogen-containing oxide, depositing the third dielectric layer includes depositing a first nitride, forming the dielectric spacers includes forming the dielectric spacers from one of the first nitride and a second nitride, and depositing the dielectric filler includes depositing tetraethyl orthosilicate (TEOS).

19. The method of claim 16, wherein depositing the first dielectric layer includes depositing the first dielectric layer to have an equivalent oxide thickness of about 10 Å, etching the opening includes etching the opening to have a height above the bottom of about 1500 Å, growing the second dielectric layer includes growing the second dielectric layer to have a thickness of about 5 Å, depositing the third dielectric layer includes depositing the third dielectric layer to have a thickness of about 10 Å, and forming the dielectric spacers includes forming the dielectric spacers to have a base thickness of about 300 Å.

20. The method of claim 17, wherein reducing the at least a portion of the first dielectric layer includes reducing the at least a portion of the first dielectric layer to have an equivalent oxide thickness of about 10 Å, etching the opening includes etching the opening to have a height above the bottom of about 1500 Å, growing the second dielectric layer includes growing the second dielectric layer to have a thickness of about 5 Å, depositing the third dielectric layer includes depositing the third dielectric layer to have a thickness of about 10 Å, and forming the dielectric spacers includes forming the dielectric spacers to have a base thickness of about 300 Å.

* * * * *